United States Patent
Ueda

(10) Patent No.: US 10,186,316 B2
(45) Date of Patent: Jan. 22, 2019

(54) SEMICONDUCTOR MEMORY DEVICE

(71) Applicant: Toshiba Memory Corporation, Tokyo (JP)

(72) Inventor: Yoshihiro Ueda, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/694,952

(22) Filed: Sep. 4, 2017

(65) Prior Publication Data
US 2018/0268897 A1    Sep. 20, 2018

(30) Foreign Application Priority Data

Mar. 15, 2017    (JP) .................................. 2017-049983

(51) Int. Cl.
*G11C 13/00*    (2006.01)

(52) U.S. Cl.
CPC ........ *G11C 13/004* (2013.01); *G11C 13/0028* (2013.01); *G11C 2013/0045* (2013.01); *G11C 2013/0047* (2013.01); *G11C 2013/0057* (2013.01)

(58) Field of Classification Search
CPC .... G11C 2013/0045; G11C 2013/0047; G11C 2013/0057
See application file for complete search history.

(56) References Cited

U.S. PATENT DOCUMENTS

| | | | |
|---|---|---|---|
| 5,901,087 A | * | 5/1999 | Pascucci ................ G11C 16/28 327/52 |
| 7,203,088 B2 | | 4/2007 | Ikegawa et al. |
| 7,239,537 B2 | * | 7/2007 | DeBrosse ............... G11C 11/16 365/154 |

(Continued)

FOREIGN PATENT DOCUMENTS

| | | |
|---|---|---|
| JP | 2005251336 A | 9/2005 |
| JP | 2013196730 A | 9/2013 |

OTHER PUBLICATIONS

Zhenyu Sun et al., Voltage Driven Nondestructive Self-Reference Sensing Scheme of Spin-Transfer Torque Memory, IEEE Transactions on Very Large Scale Integration (VLSI) Systems, vol. 20, No. 11, Nov. 2012, pp. 2020-2030.

*Primary Examiner* — Huan Hoang
*Assistant Examiner* — Jay Radke
(74) *Attorney, Agent, or Firm* — Patterson & Sheridan, LLP

(57) ABSTRACT

A semiconductor memory device includes a resistive-type memory cell and a sense amplifier for reading data from the memory cell. First and second transistors connected in parallel between a first node connected to the memory cell and a second node connected to the sense amplifier. The first transistor has a size that is different from the second transistor. Each of the first and second transistors has a gate that is connected to a first voltage source. A switch circuit controls a conduction state between the first and second nodes via separate paths through the first transistor and the second transistor. The sense amplifier compares a first current supplied to the memory cell via the first path at a first timing and a second current supplied to the memory cell via the second path at a second timing different from the first timing.

20 Claims, 11 Drawing Sheets

(56) References Cited

U.S. PATENT DOCUMENTS

| | | |
|---|---|---|
| 8,116,123 B2 | 2/2012 | Chen et al. |
| 9,058,884 B2 | 6/2015 | Ueda |
| 9,218,865 B2 | 12/2015 | Andre et al. |
| 2008/0061840 A1* | 3/2008 | Hwang .................... G11C 7/02 327/51 |

* cited by examiner

| MAGNITUDE RELATIONSHIP OF Icell1 AND Icell2 | MAGNITUDE RELATIONSHIP OF N1 AND N2 | N3 | N4 | READ DATA |
|---|---|---|---|---|
| Icell1>Icell2 | N1>N2 | L | H | 0 |
| Icell1<Icell2 | N1<N2 | H | L | 1 |

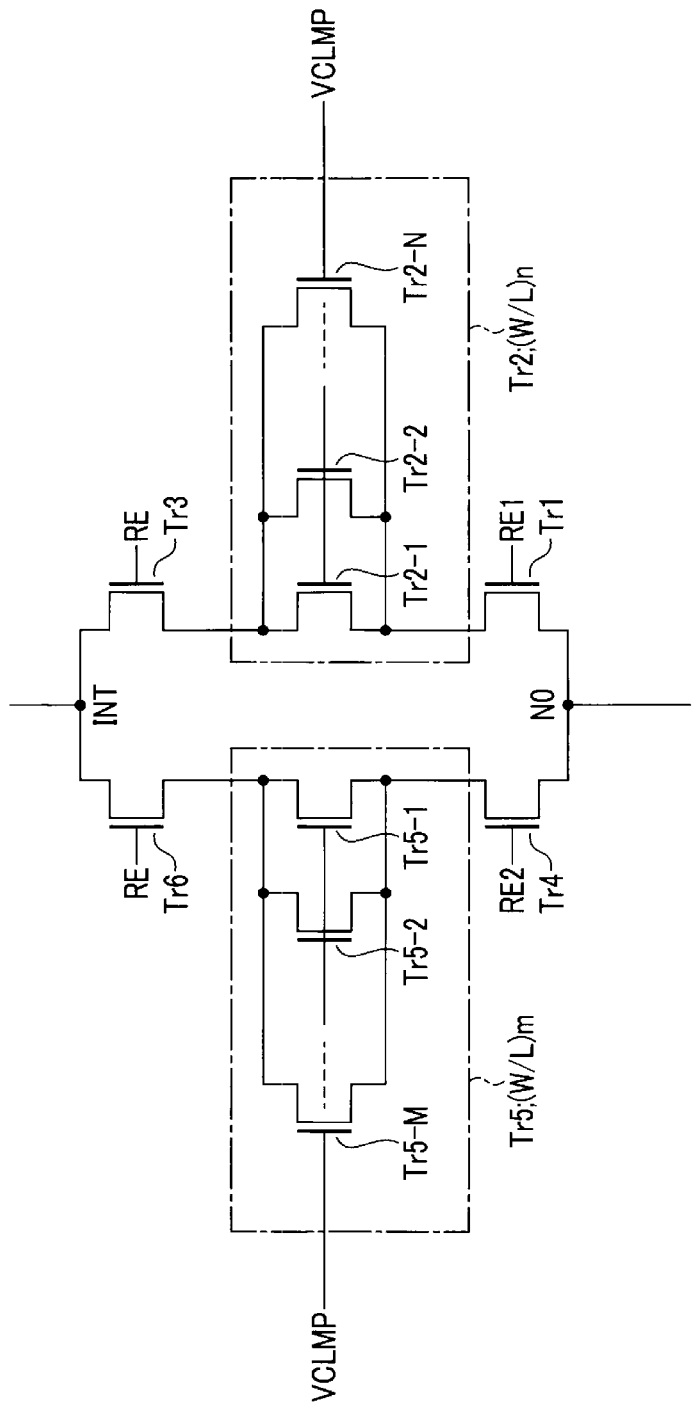

US 10,186,316 B2

SEMICONDUCTOR MEMORY DEVICE

CROSS-REFERENCE TO RELATED APPLICATION

This application is based upon and claims the benefit of priority from Japanese Patent Application No. 2017-049983, filed Mar. 15, 2017, the entire contents of which are incorporated herein by reference.

FIELD

Embodiments described herein relate generally to a semiconductor device.

BACKGROUND

There are semiconductor memory devices based on resistance change elements.

DESCRIPTION OF THE DRAWINGS

FIG. 14 is a diagram of a semiconductor memory device according to a third modification of the first embodiment.

DETAILED DESCRIPTION

Figure 1:
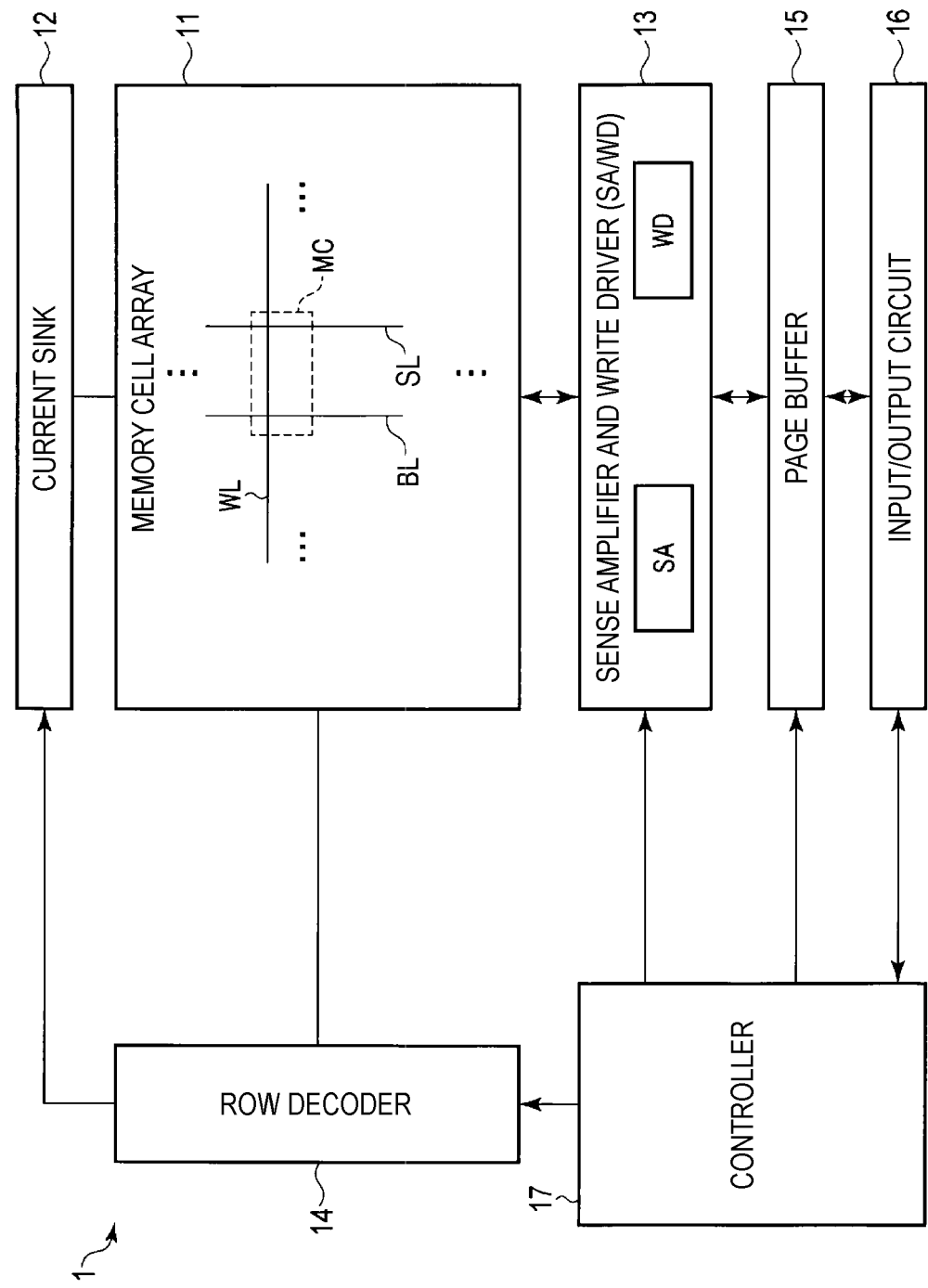
FIG. 1 is a block diagram of a semiconductor memory device according to a first embodiment.

An example embodiment provides a semiconductor memory device capable of robustly securing a sense margin in the self-reference method against the operating environment.

In general, according to one embodiment, a semiconductor memory device comprises a memory cell with a resistive memory element for storing data and a sense amplifier for reading stored data from the memory cell according to a state of the resistive memory element. A first transistor and a second transistor are connected in parallel between a first node that is electrically connected to the memory cell and a second node that is electrically connected to the sense amplifier. Each of the first and second transistors has a gate connected to a first voltage source, such as clamping voltage source for example. A switch circuit is configured to control a conduction state between the first node and the second node through a first path passing through the first transistor and a second path passing through the second transistor. The first transistor has a size that is different from a size of the second transistor. The sense amplifier compares a first current supplied to the memory cell via the first path at a first timing and a second current supplied to the memory cell via the second path at a second timing different from the first timing.

Hereinafter, example embodiments will be described with reference to the drawings. In the following description, constituent elements having the same function and configuration are denoted by a common reference numeral. Further, when distinguishing a plurality of constituent elements having the common reference numeral, subscripts may be attached to the common reference numeral to distinguish individual elements. When similar constituent elements are not required to be particularly distinguished, only the common reference numeral is used and no subscript is attached thereto.

1. First Embodiment

A semiconductor memory device according to a first embodiment will be described.

1.1 Configuration

First, a configuration of the semiconductor memory device according to the first embodiment will be described.

1.1.1 Configuration of Semiconductor Memory Device

The semiconductor memory device according to the first embodiment is a magnetic memory device based on a perpendicular magnetization method using, for example, a magnetoresistance effect (magnetic tunnel junction (MTJ)) element as a resistive memory element.

FIG. 1 is a block diagram illustrating a configuration of the semiconductor memory device 1 according to the first embodiment. As illustrated in FIG. 1, the semiconductor memory device 1 includes a memory cell array 11, a current sink 12, a sense amplifier and write driver (SA/WD) 13, a row decoder 14, a page buffer 15, an input/output circuit 16, and a controller 17.

The memory cell array 11 includes a plurality of memory cells MC in rows and columns. In addition, the memory cells MC in the same row are connected to the same word line WL, and opposite ends of the memory cells MC in the same column are connected to the same bit line BL and the same source line SL, respectively.

The current sink 12 is connected to a bit line BL and a source line SL. The current sink 12 sets the bit line BL or the source line SL to a ground potential in operations such as data writing and data reading.

The SA/WD 13 is connected to the bit line BL and the source line SL. The SA/WD 13 supplies a current to a memory cell MC that is a target of a data reading/writing operation. The current is supplied to the targeted memory cell MC via a bit line BL and a source line SL, and thereby reads or writes data to the memory cell MC. More specifically, a write driver WD in the SA/WD 13 operates to write data to memory a cell MC and a sense amplifier SA in the SA/WD 13 operates to read data from the memory cell MC.

The row decoder 14 is connected to the memory cell array 11 via a word line WL. The row decoder 14 decodes a row address designating the row of the memory cell array 11. Then, a word line WL is selected according to the decoding result, and a voltage necessary for operations, such as data writing and reading, is applied to the selected word line WL.

The page buffer 15 temporarily stores data to be written to and data read from the memory cell array 11 in units of data called pages.

The input/output circuit 16 transmits various signals received from the outside of the semiconductor memory device 1 to the controller 17 and the page buffer 15, and transmits various information from the controller 17 and the page buffer 15 to the outside of the semiconductor memory device 1.

The controller 17 is connected to the current sink 12, the SA/WD 13, the row decoder 14, the page buffer 15, and the input/output circuit 16. The controller 17 controls the current sink 12, the SA/WD 13, the row decoder 14, and the page buffer 15 according to various signals received from outside of the semiconductor memory device 1 by the input/output circuit 16.

1.1.2 Configuration of Memory Cell

Figure 2:
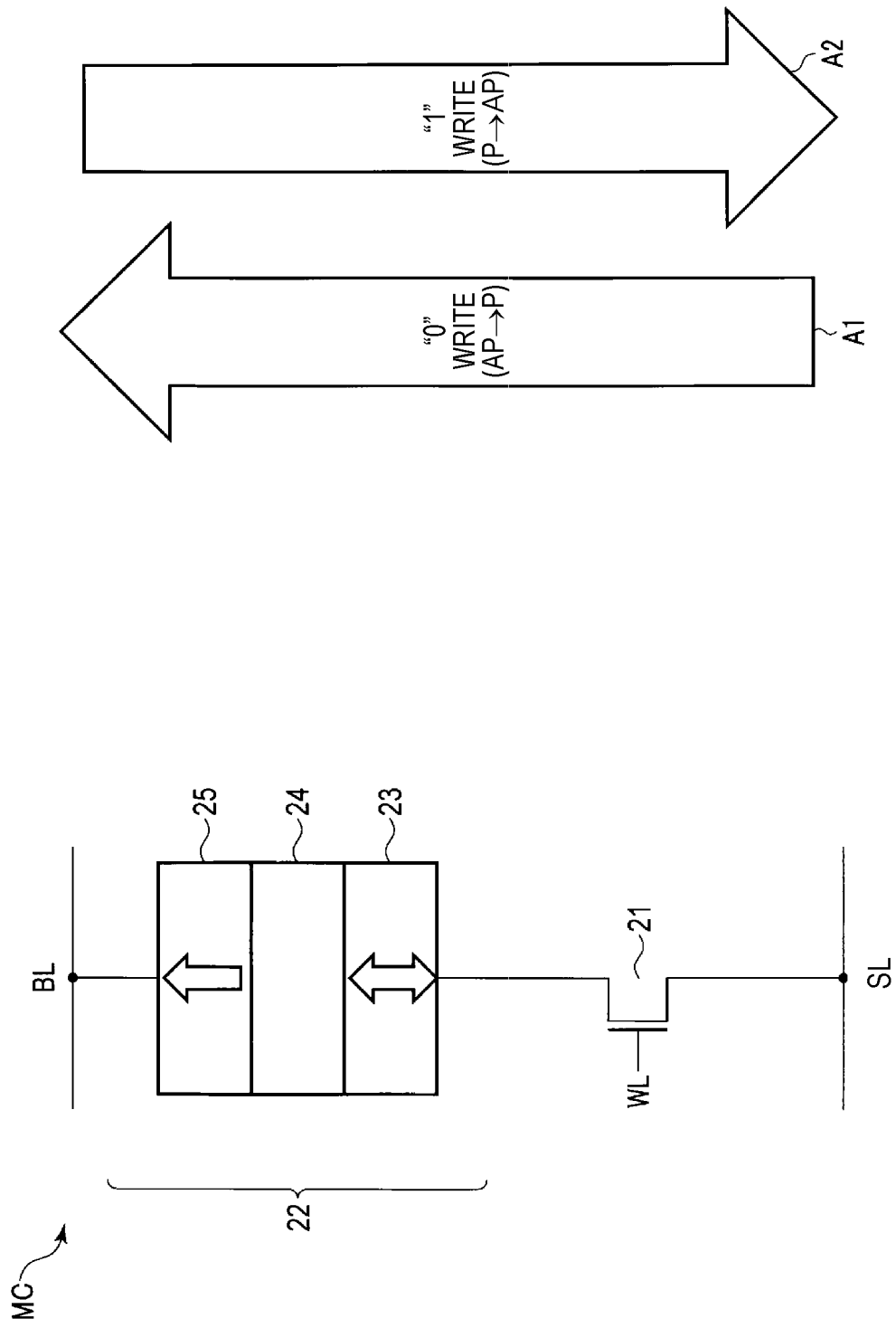
FIG. 2 is a schematic diagram of a memory cell of the semiconductor memory device according to the first embodiment.

Next, a configuration of a memory cell of the semiconductor memory device according to the first embodiment will be described with reference to FIG. 2. FIG. 2 is a schematic diagram for explaining a configuration of a memory cell MC of the semiconductor memory device 1 according to the first embodiment.

As illustrated in FIG. 2, the memory cell MC includes, for example, a selection transistor 21 and a magnetoresistance effect element 22. The selection transistor 21 is provided as a switch for controlling the supply of a current at the time of data writing to and data reading from the magnetoresistance effect element 22. The magnetoresistance effect element 22 includes a plurality of stacked films and is configured to switch between a low resistance state and a high resistance state by causing a current to flow in a direction perpendicular to the film surface. The magnetoresistance effect element 22 functions as a resistive memory element that is capable of storing data according to a change in resistance state in a nonvolatile manner. Stored data can be read from the magnetoresistance effect element 22 by determination of the resistance state.

The selection transistor 21 includes, for example, a first end connected to a source line SL, a second end connected to a first end of the magnetoresistance effect element 22, and a gate connected to a word line WL. The word line WL is commonly connected to, for example, a gate of a selection transistor 21 of another memory cell MC (not illustrated) that is arranged in the row direction of the memory cell array 11. Word lines WL are arranged, for example, in the column direction of the memory cell array 11. The source line SL extends in the column direction of the memory cell array 11 and is connected to a first end of a selection transistor 21 of another memory cell MC (not illustrated) that is arranged in the column direction of the memory cell array 11.

A second end of the magnetoresistance effect element 22 is connected to, for example, a bit line BL. The bit line BL extends in the column direction of the memory cell array 11 and is commonly connected to a second end of a magnetoresistance effect element 22 of another memory cell MC (not illustrated) arranged in the column direction of the memory cell array 11. Bit lines BL and source line SL are aligned, for example, in the column direction of the memory cell array 11.

1.1.3 Configuration of Magnetoresistance Effect Element

Next, a configuration of the magnetoresistance effect element of the semiconductor memory device according to the first embodiment will be described continuously with reference to FIG. 2.

The magnetoresistance effect element 22 includes a memory layer 23, a tunnel barrier layer 24, and a reference layer 25. The magnetoresistance effect element 22 is configured by sequentially stacking the memory layer 23, the tunnel barrier layer 24, and the reference layer 25. In this example, the magnetoresistance effect element 22 is a perpendicular magnetization type MTJ element in which the magnetization orientations of the memory layer 23 and the reference layer 25 are directed in the vertical direction perpendicular to the film surfaces.

The memory layer 23 is a ferromagnetic layer having a magnetizable axis direction in the direction perpendicular to the film surface and contains, for example, cobalt iron boron (CoFeB) or iron boride (FeB). The memory layer 23 has a magnetization orientation directed to either the selection transistor 21 side or the reference layer 25 side. The magnetization orientation of the memory layer 23 is set so as to be easily reversed as compared with the reference layer 25.

The tunnel barrier layer 24 is a nonmagnetic insulating film, and contains, for example, magnesium oxide (MgO).

The reference layer 25 is a ferromagnetic layer having a magnetization-easy axis direction in the direction perpendicular to the film surface, and contains, for example, cobalt platinum (CoPt), cobalt nickel (CoNi), or cobalt palladium (CoPd). The magnetization orientation of the reference layer 25 is fixed. The wording "the magnetization orientation is fixed" means that a current for inverting the magnetization orientation of the memory layer 23 is generally insufficient to change the magnetization orientation of the reference layer 25. The memory layer 23, the tunnel barrier layer 24, and the reference layer 25 constitute a magnetic tunnel junction.

In the first embodiment, a spin injection writing method is adopted in which a direct write current is caused to flow through the magnetoresistance effect element 22, and the magnetization orientation of the memory layer 23 is controlled by the write current. The magnetoresistance effect element 22 may take either the low resistance state or the high resistance state depending on whether the relative relationship of the magnetization orientations of the memory layer 23 and the reference layer 25 is parallel or anti-parallel.

When the write current is caused to flow through the magnetoresistance effect element 22 in the direction of an arrow A1 in FIG. 2, that is, from the memory layer 23 to the reference layer 25, the relative relation between the magnetization orientations of the memory layer 23 and the reference layer 25 becomes parallel to the magnetoresistance effect element 22. In this parallel state, the resistance value of the magnetoresistance effect element 22 is decreased, and the magnetoresistance effect element 22 is considered set to the low resistance state. This low resistance state is called a "P (parallel) state," and is defined as, for example, a state of data "0."

When the write current is caused to flow through the magnetoresistance effect element 22 in the direction of an arrow A2 in FIG. 2, that is, from the reference layer 25 to the memory layer 23, the relationship between the magnetization orientations of the memory layer 23 and the reference layer 25 becomes anti-parallel to the magnetoresistance effect element 22. In this anti-parallel state, the resistance value of the magnetoresistance effect element 22 is increased, and the magnetoresistance effect element 22 is considered set to the high resistance state. This high resistance state is called an "AP (anti-parallel) state," and is defined as, for example, a state of data "1."

The following description will be made according to the above-described data specifying method, but the method of specifying data "1" and data "0" is not limited to the above-described example. For example, the P state may be defined as data "1," and the AP state may be defined as data "0."

1.1.4 Configuration of Sense Amplifier

Figure 3:
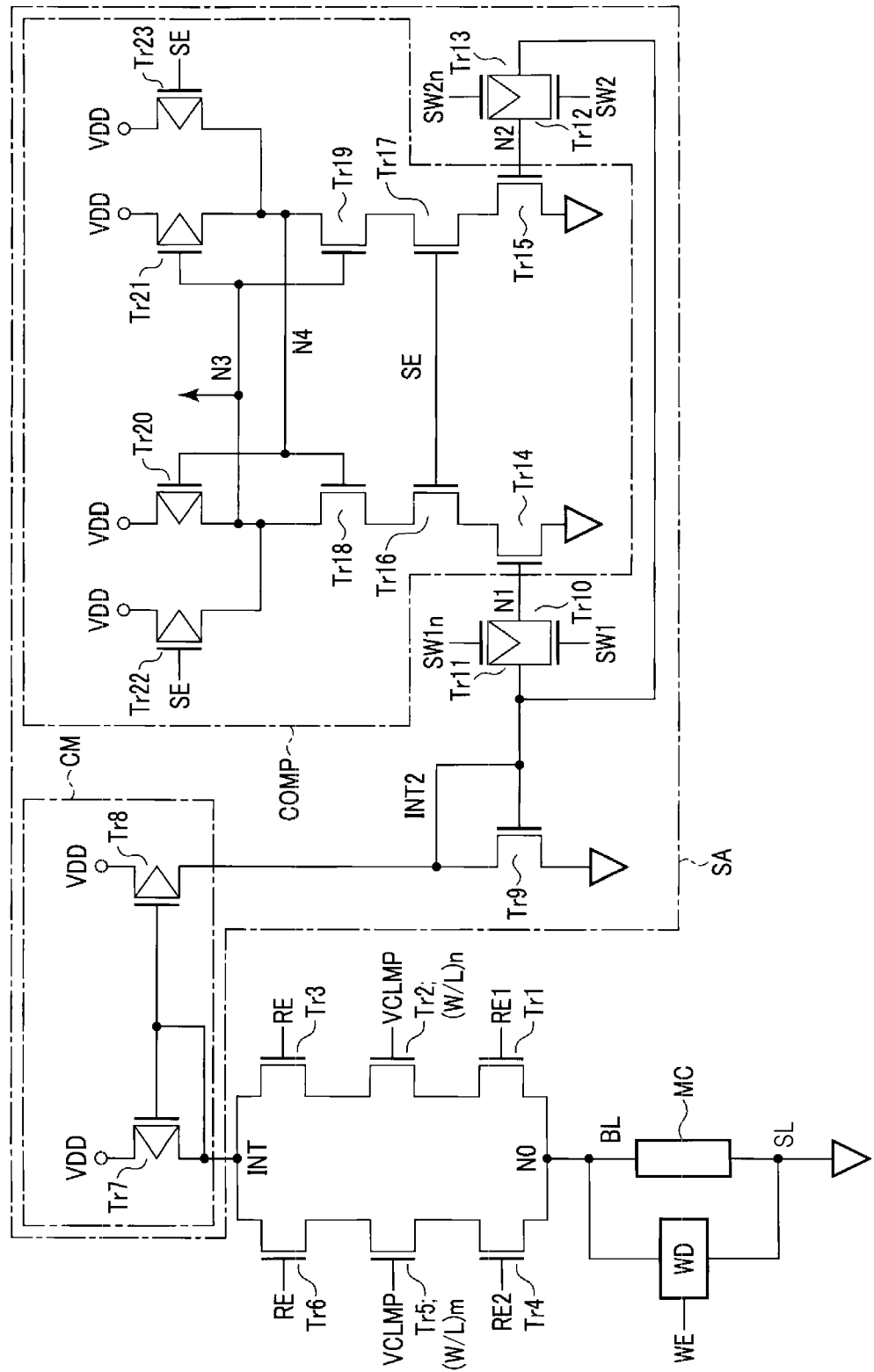
FIG. 3 is a circuit diagram of a sense amplifier and a write driver of the semiconductor memory device according to the first embodiment.

Next, a configuration of the sense amplifier of the semiconductor memory device according to the first embodiment will be described. FIG. 3 is a circuit diagram for explaining a configuration of the sense amplifier and the write driver of the semiconductor memory device according to the first embodiment.

As illustrated in FIG. 3, for example, the write driver WD is connected to a first end of a memory cell MC via a bit line BL, and is connected to a second end of the memory cell MC via a source line SL. The write driver WD receives a signal WE. The signal WE is, for example, a signal commonly input to the write driver WD when data "0" and data "1" are to be written to the memory cell MC.

The first end of the memory cell MC is connected to a node N0 via the bit line BL. The memory cell MC is connected to the sense amplifier SA via node N0 and node INT. Between the nodes N0 and INT, there is a current path passing through transistors Tr1, Tr2, and Tr3 (connected in series) and another current path passing through transistors Tr4, Tr5, and Tr6 (connected in series). These two current paths are provided in parallel to each other between the nodes N0 and INT. The transistors Tr1 to Tr6 have, for example, an n-channel polarity. The transistors Tr1, Tr3, and transistors Tr4, and Tr6 have a function of cutting off respective the current path passing through a one of the transistors Tr2 and Tr5 when the current path passing through the other is connected. That is, each of the transistors Tr1, Tr3, Tr4, and Tr6 functions as a switch circuit for forming a current path through which the nodes N0 and INT are connected to each other via one of the transistors Tr2 and Tr5. Each of the transistors Tr1, Tr3, Tr4, and Tr6 may have a function of simultaneously cutting current paths passing through any of the transistors Tr2 and Tr5.

Specifically, the transistor Tr1 includes a first end connected to the node N0, a second end connected to a first end of the transistor Tr2, and a gate supplied with a signal RE1. The transistor Tr2 includes a second end connected to a first end of the transistor Tr3 and a gate supplied with a voltage VCLMP. The transistor Tr3 includes a second end connected to the node INT and a gate supplied with a signal RE.

In addition, the transistor Tr4 includes a first end connected to the node N0, a second end connected to a first end of the transistor Tr5, and a gate supplied with a signal RE2. The transistor Tr5 includes a second end connected to a first end of the transistor Tr6 and a gate supplied with the voltage VCLMP. The transistor Tr6 includes a second end connected to the node INT and a gate supplied with the signal RE.

The voltage VCLMP is, for example, larger than a threshold voltage Vth of the transistors Tr2 and Tr5. Each of the transistors Tr2 and Tr5 transmits a voltage (VCLMP-Vth) to the first end when a voltage larger than the voltage VCLMP is supplied to the second ends of the transistors Tr2 and Tr5. The transistors Tr2 and Tr5 have different transistor sizes. Here, the "size" of a transistor includes, for example, a gate width W and/or a gate length L. The "size" of the transistor may also be represented by a ratio (W/L) of the gate width W to the gate length L. In the example of the first embodiment, the size (W/L)n of the transistor Tr2 is, for example, larger than the size (W/L)m of the transistor Tr5 (that is, the expression (W/L)n>(W/L)m is satisfied).

The sense amplifier SA includes an input end connected to the node INT and an output end connected to a node N3. The sense amplifier SA includes transistors Tr7, Tr8, Tr9, Tr10, Tr11, Tr12, Tr13, Tr14, Tr15, Tr16, Tr17, Tr18, Tr19, Tr20, Tr21, Tr22, and Tr23. The transistors Tr9, Tr10, Tr12, and Tr14 to Tr19 have, for example, an n-channel polarity. The transistors Tr7, Tr8, Tr11, Tr13, and Tr20 to Tr23 have, for example, a p-channel polarity.

The transistors Tr7 and Tr8 constitute a current mirror circuit CM having a first end connected to the node INT and a second end connected to a node INT2. Specifically, the transistor Tr7 includes a first end and a gate connected to the node INT, and a second end supplied with a voltage VDD. The transistor Tr8 includes a first end connected to the node INT2, a second end supplied with the voltage VDD, and a gate connected to the node INT. The voltage VDD is, for example, larger than the voltage VCLMP.

The transistor Tr9 includes a first end and a gate connected to the node INT2, and a second end that is grounded.

The transistor Tr10 includes a first end connected to the node INT2, a second end connected to a node N1, and a gate supplied with a signal SW1. The transistor Tr11 includes a first end connected to the node INT2, a second end connected to the node N1, and a gate supplied with a signal SW1n (/SW1).

The transistor Tr12 includes a first end connected to the node INT2, a second end connected to a node N2, and a gate supplied with a signal SW2. The transistor Tr13 includes a first end connected to the node INT2, a second end connected to the node N1, and a gate supplied with the signal SW2n (/SW2).

The transistors Tr14 to Tr23 constitute a comparison circuit COMP including a first input end connected to the node N1, a second input end connected to the node N2, and an output end connected to the node N3 or N4. FIG. 3 illustrates an exemplary case where the output end is connected to the node N3.

Specifically, the transistor Tr14 includes a first end that is grounded, a second end connected to a first end of the transistor Tr16, and a gate connected to the node N1. The transistor Tr15 includes a first end that is grounded, a second end connected to a first end of the transistor Tr17, and a gate connected to the node N2. The gate of the transistor Tr14 and the gate of the transistor Tr15 also function as capacitors for holding the voltage values of the nodes N1 and N2, respectively.

The transistor Tr16 includes a second end connected to a first end of the transistor Tr18 and a gate supplied with a signal SE. The transistor Tr17 includes a second end connected to a first end of the transistor Tr19 and a gate supplied with the signal SE.

The transistor Tr18 includes a second end connected to the node N3 and a gate connected to the node N4. The transistor Tr19 includes a second end connected to the node N4 and a gate connected to the node N3.

The transistor Tr20 includes a first end connected to the node N3, a second end supplied with the voltage VDD, and a gate connected to the node N4. The transistor Tr21 includes a first end connected to the node N4, a second end supplied with the voltage VDD, and a gate connected to the node N3.

The transistor Tr22 includes a first end connected to the node N3, a second end supplied with the voltage VDD, and a gate supplied with the signal SE. The transistor Tr23 includes a first end connected to the node N4, a second end supplied with the voltage VDD, and a gate supplied with the signal SE.

In the example of FIG. 3, the output end of the sense amplifier SA is connected to the node N3, but the present disclosure is not limited thereto. The output end may instead be connected to the node N4 in some embodiments.

1.2 Operation

Next, an operation of the semiconductor memory device according to the first embodiment will be described.

1.2.1 Read Operation

A read operation of the semiconductor memory device according to the first embodiment will be described. A self-reference method is applied to the read operation of the semiconductor memory device according to the first embodiment. In the self-reference method, a read result from reading written target data from a memory cell MC is compared with a read result from reading written predetermined data from the same memory cell MC. Then, as a result of the comparison, it is determined whether the reading target data is data "0" or "1".

Figure 4:
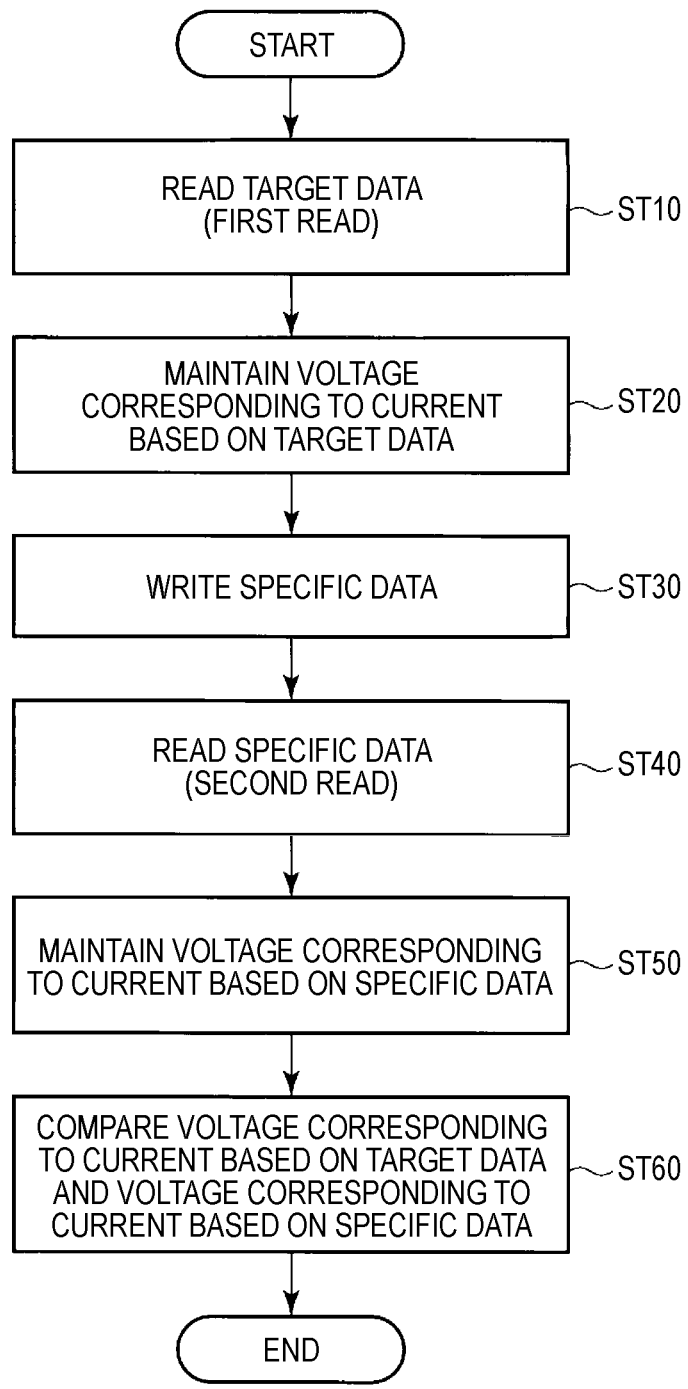
FIG. 4 is a flowchart of a read operation of the semiconductor memory device according to the first embodiment.

FIG. 4 is a flowchart for explaining a read operation of the semiconductor memory device according to the first embodiment based on the self-reference method. In the following description, data which has been written into a memory cell MC and is now to be read from the memory cell MC according to a read command or the like will be referred to as "target data." In addition, data which has been specifically written as predetermined data into the memory cell MC will be referred to as "specific data." In the first embodiment, data "0" is used as the specific data.

As illustrated in FIG. 4, in aspect ST10, the sense amplifier SA reads target data from the memory cell MC. In the following description, this read operation will also be referred to as a "first read operation."

In aspect ST20, the sense amplifier SA holds information corresponding to a current according to the just read target data as a voltage level at the node N1.

In aspect ST30, the write driver WD writes the specific data to the memory cell MC. As a result, the previously stored target data is lost (overwritten) in the memory cell MC.

In aspect ST40, the sense amplifier SA now reads the specific data from the memory cell MC. In the following description, this read operation is also referred to as a "second read operation."

In aspect ST50, the sense amplifier SA holds information corresponding to a current according to the just read specific data as a voltage level at the node N2.

In aspect ST60, the sense amplifier SA compares the voltage corresponding to the current based on the target data to the voltage corresponding to the current based on the specific data. Based on the comparison, the sense amplifier SA determines whether the read target data is data "0" or "1."

The read operation by the self-reference method is then completed.

Figure 5:
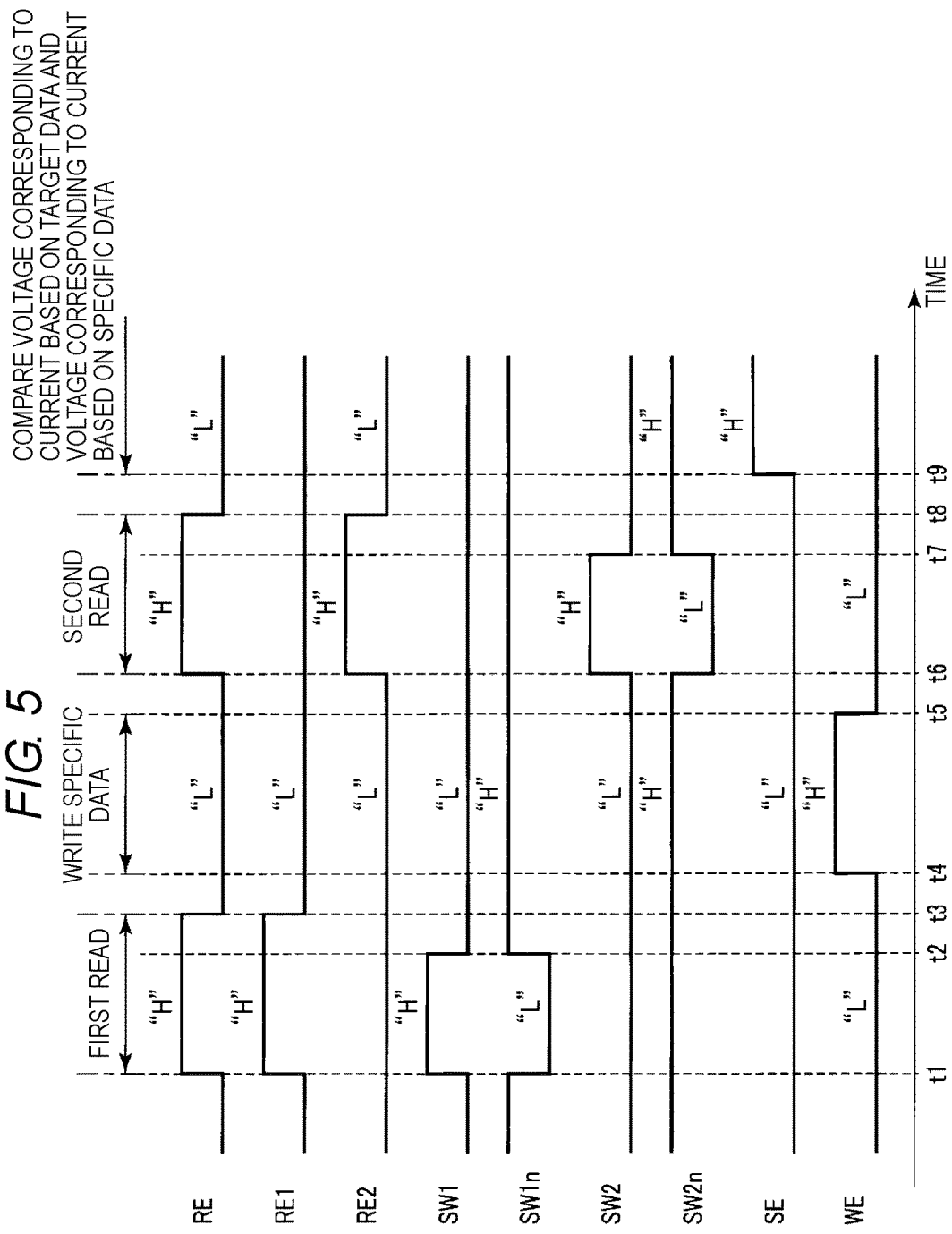
FIG. 5 is a timing chart of a read operation of the semiconductor memory device according to the first embodiment.
Figure 6:
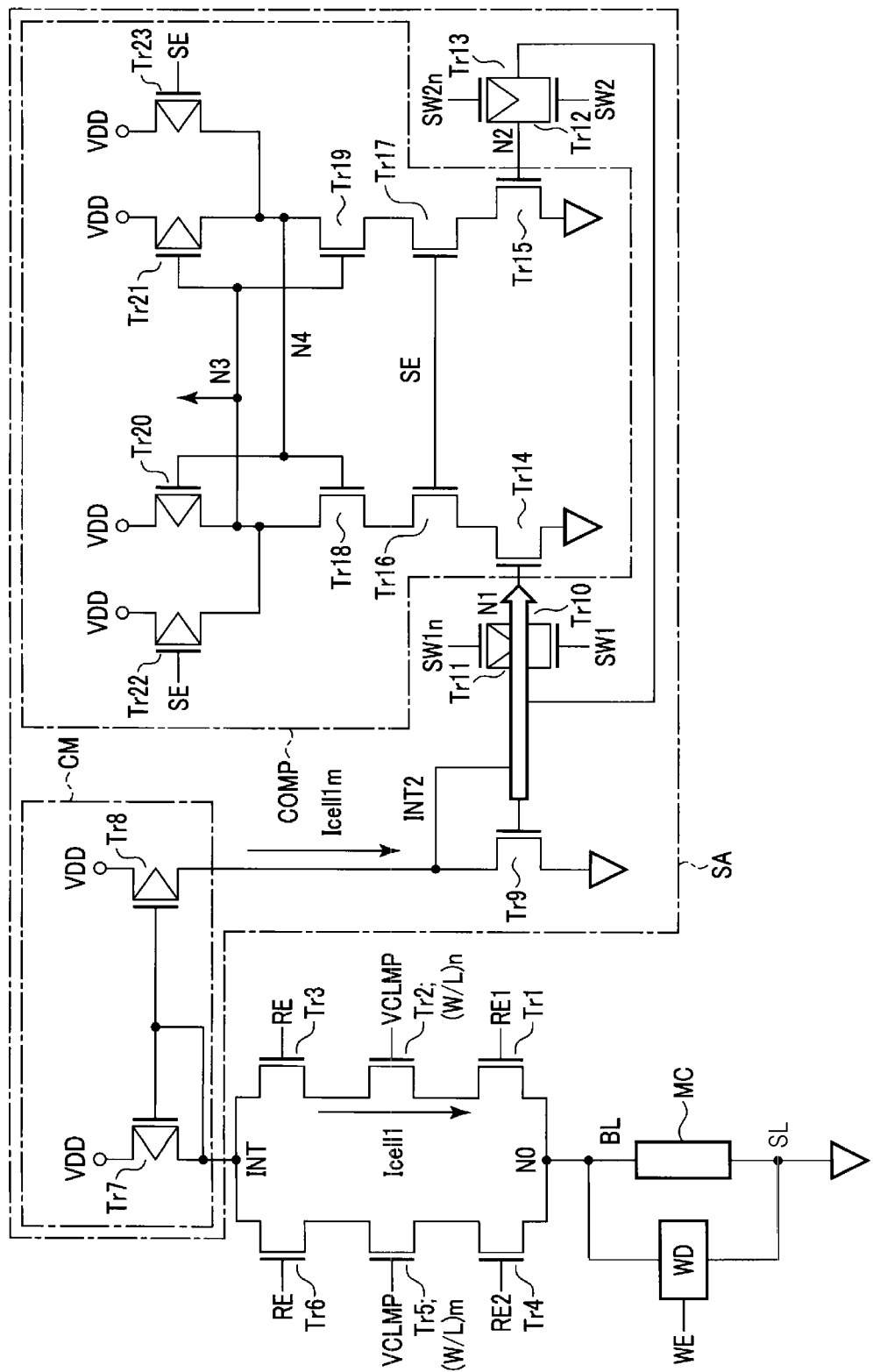
FIG. 6 is a schematic diagram for explaining a first read operation of the semiconductor memory device according to the first embodiment.
Figure 7:
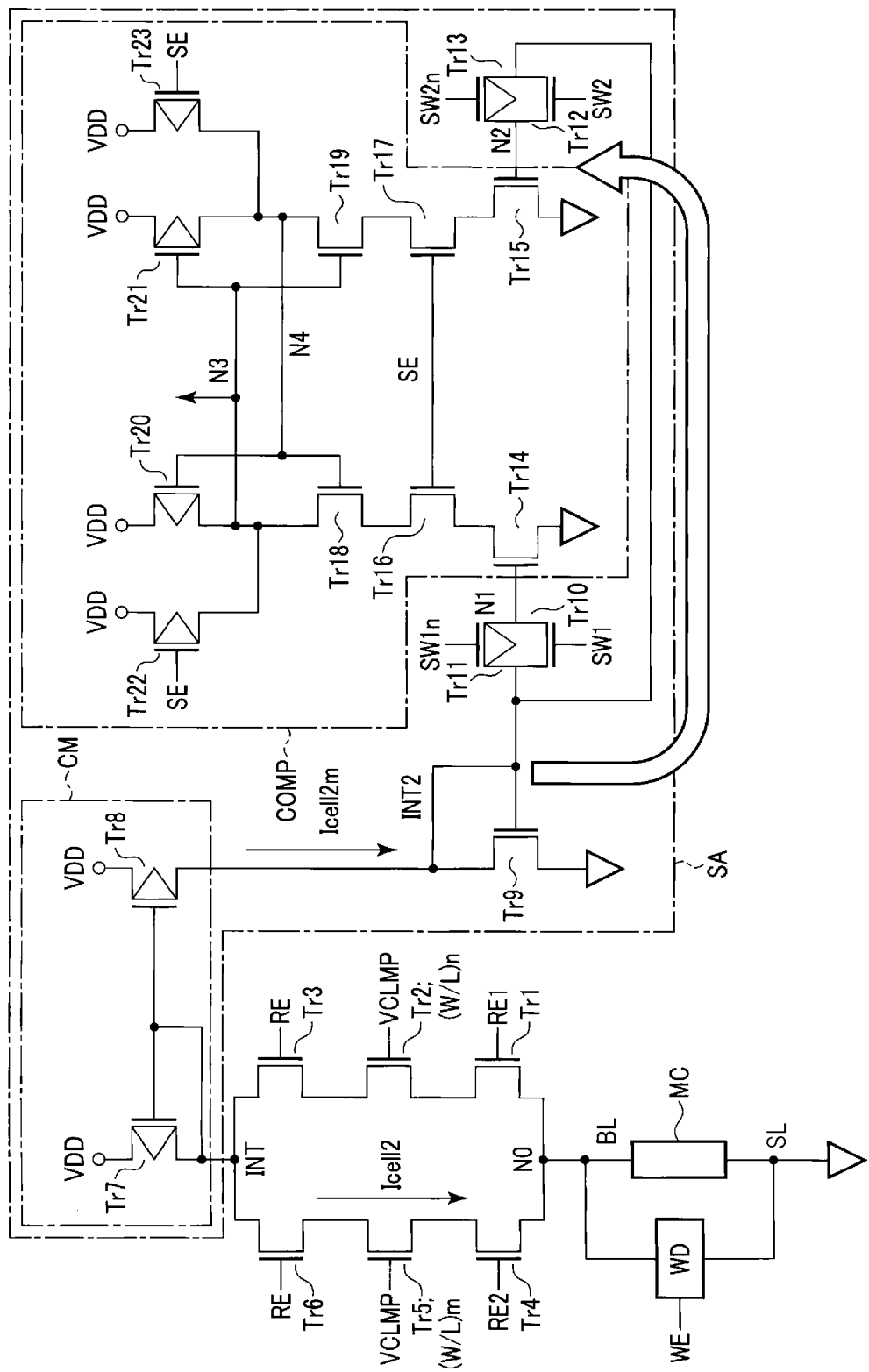
FIG. 7 is a schematic diagram for explaining a second read operation of the semiconductor memory device according to the first embodiment.
Figures 8, 9:
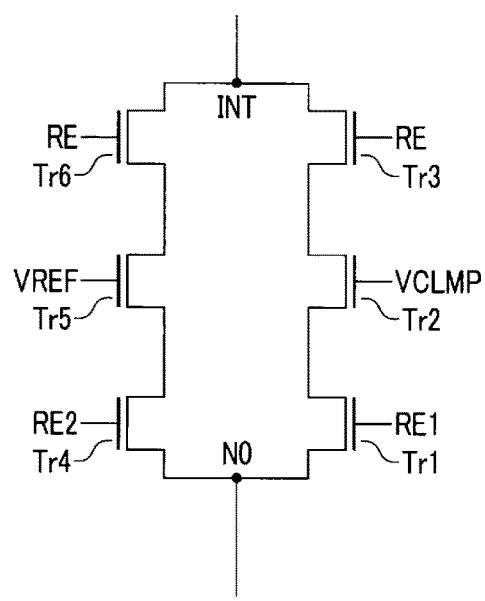
FIG. 8 is a table related to a comparison operation of the semiconductor memory device according to the first embodiment.
FIG. 9 is a circuit diagram for explaining a related technique.

FIG. 5 is a timing chart for explaining the read operation of the semiconductor memory device according to the first embodiment. FIG. 5 illustrates the relationship between the various signals supplied to the SA/WD 13 illustrated in FIG. 3 and the read operation. In addition, FIGS. 6 and 7 are schematic diagrams for explaining the first read operation and the second read operation of the semiconductor memory device according to the first embodiment, respectively. Further, FIG. 8 is a table for explaining a comparison operation of the semiconductor memory device according to the first embodiment. In the following description, the read operation will be described with reference to FIGS. 6 to 8 along with the timing chart of FIG. 5.

As illustrated in FIG. 5, the first read operation is executed from time t1 to time t3.

Specifically, at time t1, a signal RE of "H (high)" level is supplied, so that the transistors Tr3 and Tr6 go into an ON state. In addition, a signal RE1 of "H" level is supplied, so that the transistor Tr1 goes into an ON state. Meanwhile, a signal RE2 of "L (low)" level is supplied, so that the transistor Tr4 goes into an OFF state. Thus, among the current paths connecting the nodes INT and NO, the current path passing through the transistors Tr1 to Tr3 is electrically connected, but the current path passing through the transistors Tr4 to Tr6 is electrically disconnected. That is, the voltage (VCLMP-Vth) is transmitted to the node NO via the transistors Tr1 to Tr3. In addition, a signal SW1 of "H" level and a signal SW1n of "L" level are supplied, so that the transistors Tr10 and Tr11 go into an ON state. Meanwhile, a signal SW2 of "L" level and a signal SW2n of "H" level are supplied, so that the transistors Tr12 and Tr13 go into an OFF state. As a result, the node N1 is electrically connected to the node INT2, but the node N2 is electrically disconnected from the node INT2.

By operating as described above, as illustrated in FIG. 6, a first read current Icell1 flows through the current path passing through the transistors Tr1 to Tr3 to the memory cell MC. Further, the current mirror circuit CM supplies a mirror current Icell1m of the first read current Icell1 to the node INT2. The mirror current Icell1m is voltage-converted by the transistor Tr9 and transmitted to the node N1.

Referring back to FIG. 5, the self-reference type read operation will be described.

At time t2, the signal SW1 of "L" level and the signal SW1n of "H" level are supplied, so that the transistors Tr10 and Tr11 go into an OFF state. As a result, the supply of the mirror current Icell1m to the node N1 is completed, and the voltage associated with the first read current Icell1 is held at the node N1.

At time t3, the signal RE of "L" level is supplied, so that the transistors Tr3 and Tr6 go into an OFF state. In addition, the signal RE1 of "L" level is supplied, so that the transistor Tr1 goes into an OFF state. As a result, the supply of the first read current Icell1 to the memory cell MC is stopped, and the first read operation is completed.

Subsequently, the write operation of specific data is executed from time t4 to time t5.

Specifically, at time t4, a signal WE of "H" level is supplied. As a result, the write driver WD supplies a write current to the memory cell MC via the bit line BL and the source line SL, and writes specific data to the memory cell MC. When the specific data is data "0," the write current flows from the source line SL toward the bit line BL.

At time t5, the signal WE of "L" level is supplied, so that the write driver WD stops the supply of the write current to the memory cell MC.

By operating as described above, data "0" is written as specific data in the memory cell MC.

Subsequently, the second read operation is executed from time t6 to time t8.

Specifically, at time t6, the signal RE of "H" level is supplied, so that the transistors Tr3 and Tr6 go into an ON state. In addition, the signal RE2 of "H" level is supplied, so that the transistor Tr4 goes into an ON state. Meanwhile, the signal RE1 of "L" level is supplied, so that the transistor Tr1 goes into an OFF state. Thus, among the current paths connecting the nodes INT and N0, the current path through the transistors Tr4 to Tr6 is electrically connected, but the current path through the transistors Tr1 to Tr3 is electrically disconnected. That is, the voltage (VCLMP-Vth) is transmitted to the node N0 via the transistors Tr4 to Tr6. In addition, the signal SW2 of "H" level and the signal SW2n of "L" level are supplied, so that the transistors Tr12 and Tr13 go into an ON state. Meanwhile, the signal SW1 of "L" level and the signal SW1n of "H" level are supplied, so that the transistors Tr10 and Tr11 go into an OFF state. As a result, the node N2 is electrically connected to the node INT2, but the node N1 is electrically disconnected from the node INT2.

By operating as described above, as illustrated in FIG. 7, a second read current Icell2 flows through the current path passing through the transistors Tr4 to Tr6 to the memory cell MC. Further, the current mirror circuit CM supplies a mirror current Icell2m of the second read current Icell2 to the node INT2. The mirror current Icell2m is voltage-converted by the transistor Tr9 and transmitted to the node N2.

Referring back to FIG. 5, the self-reference type read operation will be described.

At time t7, the signal SW2 of "L" level and the signal SW2n of "H" level are supplied, so that the transistors Tr12 and Tr13 go into an OFF state. As a result, the supply of the mirror current Icell2m to the node N2 is completed, and the voltage associated with the second read current Icell2 is held at the node N2.

At time t8, the signal RE of "L" level is supplied, so that the transistors Tr3 and Tr6 go into an OFF state. In addition, the signal RE2 of "L" level is supplied, so that the transistor Tr4 goes into an OFF state. As a result, the supply of the second read current Icell2 to the memory cell MC is stopped, and the second read operation is completed.

Subsequently, after time t9, a comparison operation is executed to compare the voltage corresponding to the current Icell1 based on the target data and the voltage corresponding to the current Icell2 based on the specific data.

At time t9, a signal SE of "H" level is supplied, so that the transistors Tr16 and Tr17 go into an ON state, and the transistor Tr22 and Tr23 go into an OFF state. Accordingly, the voltages of the nodes N3 and N4 are adjusted such that the transistors Tr18 to Tr21 go into an ON state. Thus, a current path passing through the transistors Tr20, Tr18, Tr16, and Tr14 and a current path passing through the transistors Tr21, Tr19, Tr17, and Tr15 are formed.

As illustrated in FIG. 8, when the first read current Icell1 is larger than the second read current Icell2 (Icell1>Icell2), the voltage of the node N1 is larger than the voltage of the node N2 (N1>N2). In this case, more current flows in the current path passing through the transistor Tr14 than in the current path passing through the transistor Tr15. Therefore, the voltage of the node N3 becomes smaller than the voltage of the node N4, and finally the node N3 is latched to the "L" level and the node N4 is latched to the "H" level. The sense amplifier SA determines the data of the memory cell MC based on the output level from the node N3. Specifically, the sense amplifier SA determines that the data read from the memory cell MC is data "0" when the node N3 is at "L" level.

Meanwhile, when the first read current Icell1 is smaller than the second read current Icell2 (Icell1<Icell2), the voltage of the node N1 is smaller than the voltage of the node N2 (N1<N2). In this case, more current flows in the current path passing through the transistor Tr15 than in the current path passing through the transistor Tr14. Therefore, the voltage of the node N3 becomes larger than the voltage of the node N4, and finally the node N3 is latched to the "H" level and the node N4 is latched to the "L" level. The sense amplifier SA determines that the data read from the memory cell MC is data "1" when the node N3 is at "H" level.

By operating as described above, it is possible to read data from the memory cell MC.

1.3 Effect of Example Embodiment

Figure 10:
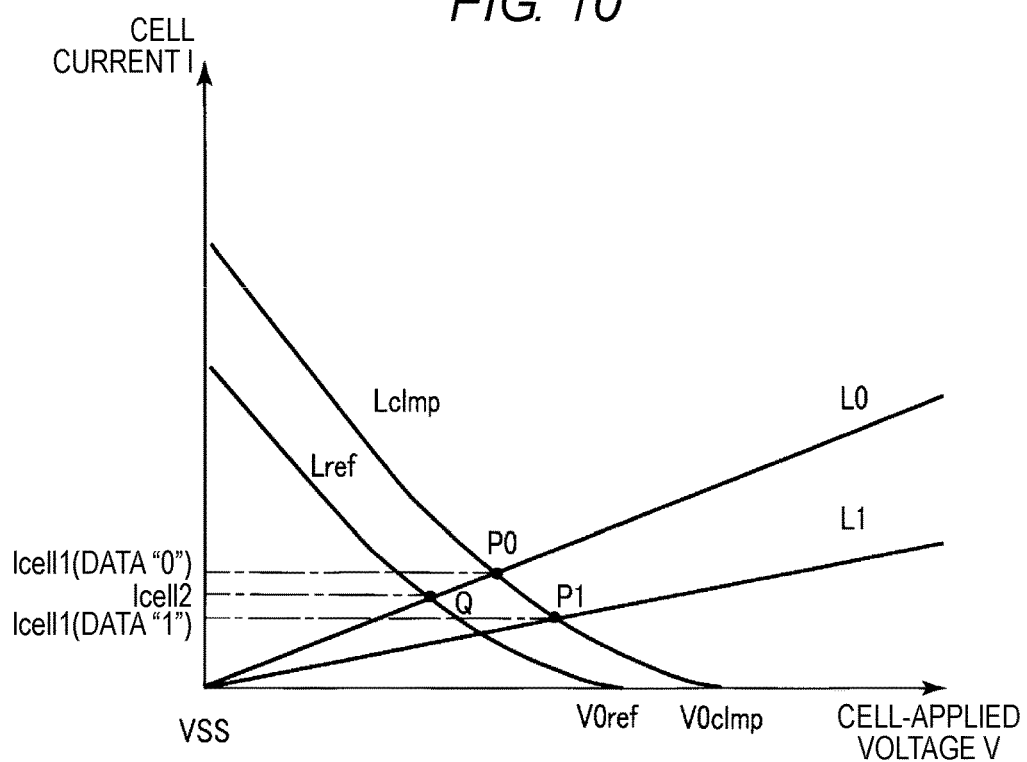
FIG. 10 is a diagram for explaining a related technique.

FIGS. 9 and 10 are respectively a circuit diagram and a diagram for explaining a related technique. FIG. 9 illustrates the circuit configurations of the transistors Tr1 to Tr6 in the related technique. FIG. 10 illustrates a diagram of operating point analysis of transistors Tr2, Tr5 and a memory cell MC in the related technique.

As illustrated in FIG. 9, transistors Tr2 and Tr5 having the same size are provided in the related technique. In addition, a voltage VREF different from the voltage VCLMP is supplied to the gate of the transistor Tr5. The voltage VREF may be larger or smaller than the voltage VCLMP. When the voltage VREF is smaller than the voltage VCLMP, the related technique corresponds to the first embodiment. The other components of the related technique are the same as those of the first embodiment in FIG. 3. With the above configuration, in the related technique, the current flowing through the current path passing through the transistor Tr2 and the current flowing through the current path passing through the transistor Tr5 may be made different by using two different voltages VCLMP and VREF. Therefore, it is possible to read data from the memory cell MC by the self-reference method.

Details of the related technique will be described with reference to FIG. 10. In FIG. 10, a straight line L0 indicates a relationship between a cell-applied voltage V applied to a first end of a memory cell MC in which the data "0" is written, and a cell current I flowing when the cell-applied voltage V is applied. A straight line L1 indicates a relationship between the cell-applied voltage V applied to the first end of the memory cell MC in which the data "1" is written and the cell current I flowing when the cell-applied voltage V is applied. In addition, a curved line Lclmp indicates a relationship between the current flowing through the transistor Tr2 and the voltage (VCLMP-Vth) at the first end of the transistor Tr2 when the current flows through the transistor Tr2. A curved line Lref indicates a relationship between the current flowing through the transistor Tr5 and the voltage (VREF-Vth) at the first end of the transistor Tr5 when the current flows through the transistor Tr5.

As illustrated in FIG. 10, when a current flows through the memory cell MC via the current path including the transistor Tr2, the current flowing through the transistor Tr2 and the cell current I, and the voltage (VCLMP-Vth) at the first end of the transistor Tr2 and the cell-applied voltage V coincide with each other. Therefore, the cell current I and the cell-applied voltage V in the first read operation correspond to an intersection point P0 of the straight line L0 and the curved line Lclmp, or an intersection point P1 of the straight line L1 and the curved line Lclmp. More specifically, the cell current I and the cell-applied voltage V correspond to the intersection point P0 when the data of the memory cell MC is data "0," and correspond to the intersection point P1 when the data is data "1."

Similarly, when a current flows through the memory cell MC via the current path including the transistor Tr5, the current flowing through the transistor Tr5 and the cell current I, and the voltage (VREF-Vth) at the first end of the transistor Tr5 and the cell-applied voltage V coincide with each other. Therefore, the cell current I and the cell-applied voltage V in the second read operation correspond to an intersection point Q of the straight line L0 and the curved line Lref. Since the voltage VCLMP is larger than the voltage VREF, the cell current Icell2 corresponding to the intersection point Q is smaller than the cell current Icell (data "0") corresponding to the intersection point P0.

Therefore, in the related technique, the data of the memory cell MC may be read based on the relationship shown in FIG. 8 by setting the voltages VREF and VCLMP such that the cell current Icell2 corresponding to the intersection point Q is larger than the cell current Icell1 (data "1") corresponding to the intersection point P1. From the viewpoint of ensuring the sense margin, it is desirable that the cell current Icell2 corresponding to the intersection point Q is between the cell currents Icell1 corresponding to the intersection points P0 and P1, respectively.

However, as described above, in the related technique, the transistors Tr2 and Tr5 have the same size and are driven by the different voltages VCLMP and VREF, respectively. Therefore, the curved lines Lref and Lclmp have a relationship that they are coincident with each other when shifted along the voltage direction on the graph. That is, a point V0$clmp$ at which the cell current I becomes "0" for the curved line Lclmp is different from a point V0$ref$ at which the cell current I becomes "0" for the curved line Lref. In this case, if the curved lines Lref and Lclmp are shifted in the voltage direction, the relationship between the intersection point Q and the intersection points P0 and P1 might not be maintained. That is, in the related technique, in a case where the curved lines Lref and Lclmp are shifted due to fluctuations of the threshold voltage Vth of the transistors Tr2 and Tr5 associated with factors such as manufacturing error and temperature fluctuation, or due to the fluctuation of the ground voltage VSS associated with an IR (current-resistance) drop, the relationship between the intersection point Q and the intersection points P0 and P1 may not be maintained. Therefore, in this related technique, the sense margin may not be robustly secured against fluctuation of the operating environment.

However, in the semiconductor memory device according to the first embodiment, the transistors Tr2 and Tr5 have different sizes and are driven by substantially the same voltage VREF. Therefore, the sense margin may be more robustly secured against the fluctuation of the operating environment.

Figure 11:
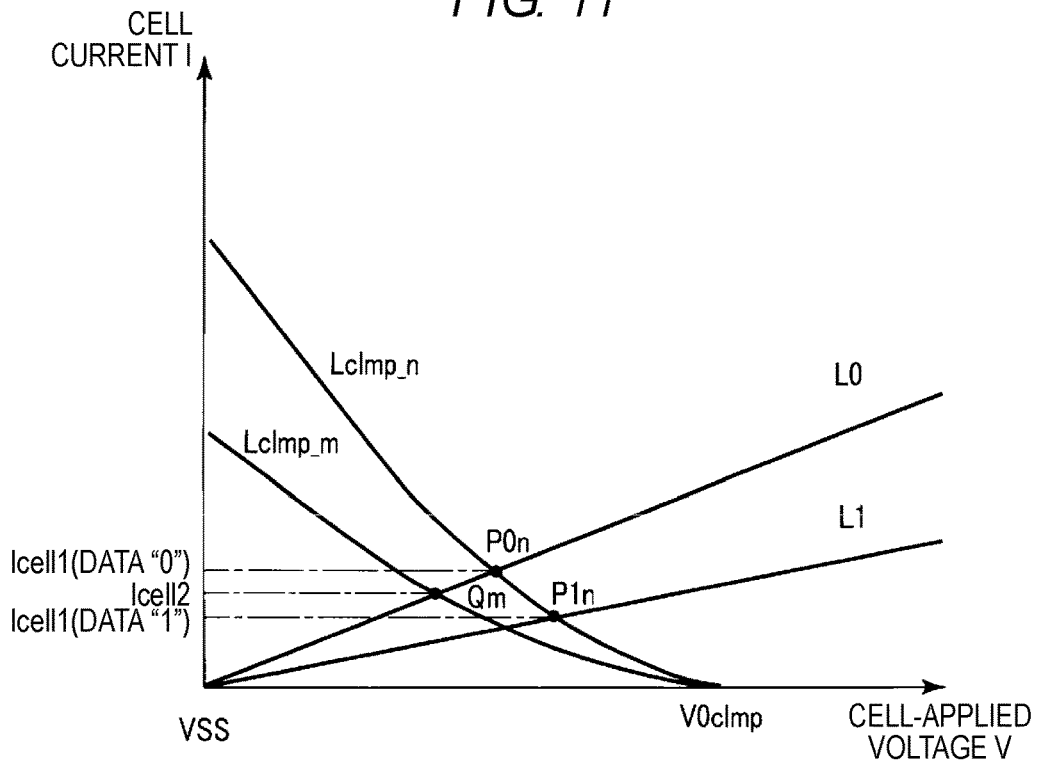
FIG. 11 is a diagram for explaining an effect of the semiconductor memory device according to the first embodiment.

FIG. 11 is a diagram for explaining an effect of the semiconductor memory device according to the first embodiment. FIG. 11 illustrates a diagram of operating point analysis of transistors Tr2, Tr5 and memory cells MC in the first embodiment.

In FIG. 11, a curved line Lclmp_n indicates a relationship between the current flowing through the transistor Tr2 and the voltage (VCLMP-Vth) at the first end of the transistor Tr2 when the current flows through the transistor Tr2. A curved line Lclmp_m indicates a relationship between the current flowing through the transistor Tr5 and the voltage (VCLMP-Vth) at the first end of the transistor Tr5 when the current flows through the transistor Tr5. Since the straight lines L0 and L1 are the same as those in FIG. 10, the explanation thereof is omitted.

As illustrated in FIG. 11, the cell current I and the cell-applied voltage V in the first read operation correspond to an intersection point P0$n$ of the straight line L0 and the curved line Lclmp_n, or an intersection point P1$n$ of the straight line L1 and the curved line Lclmp_n. More specifically, the cell current I and the cell-applied voltage V correspond to the intersection point P0$n$ when the data of the memory cell MC is data "0," and correspond to the intersection point P1$n$ when the data is data "1." Similarly, the cell current I and the cell-applied voltage V in the second read operation correspond to an intersection point Qm of the straight line L0 and the curved line Lclmp_m. Since the size (W/L)m of the transistor Tr5 is smaller than the size (W/L) n of the transistor Tr2, the cell current Icell2 corresponding to the intersection point Qm is lower than the cell current Icell1 (data "0") corresponding to the intersection point P0$n$.

Therefore, in the first embodiment, the data of the memory cell MC may be read based on the relationship shown in FIG. 8 by setting the voltages VCLMP and the sizes of the transistors Tr2 and Tr5 such that the cell current Icell2 corresponding to the intersection point Qm is larger than the cell current Icell (data "1") corresponding to the intersection point P1$n$. From the viewpoint of ensuring the sense margin, it is desirable that the cell current Icell2 corresponding to the intersection point Qm is intermediate between the cell currents Icell1 corresponding to the intersection points P0$n$ and P1$n$, respectively.

As described above, the transistors Tr2 and Tr5 have different size, but are driven by substantially the same voltage (voltage VCLMP). Therefore, the curved line Lclmp_m has a similarity relationship obtained by extending and contracting the curved line Lclmp_n along the current direction. That is, the curved lines Lclmp_m and Lcomp_n have the same point V0$clmp$ at which the current becomes "0." In this case, even when the curved lines Lclmp_n and Lclmp_m are shifted in the voltage direction, the relationship between the intersection point Qm and the intersection points P0$n$ and P1$n$ is maintained. That is, in the first embodiment, even in a case where the curved lines Lclmp_n and Lclmp_m are shifted in the voltage direction, due to fluctuation of threshold voltage Vth of the transistors Tr2 and Tr5, which might be associated with factors such as manufacturing error or temperature fluctuation, or perhaps due to a fluctuation of the ground voltage VSS associated with the IR drop, the relationship between the intersection point Qm and the intersection points P0$n$ and P1$n$ may not be maintained. Therefore, it is possible to secure the sense margin in the self-reference method more robustly against the operating environment.

2. Modifications

Further, the semiconductor memory device according to the first embodiment is not limited to the specific example described above, and various modifications are applicable.

2.1 First Modification

In the first embodiment, descriptions have been made on the case where the data "0" is written as the specific data, but the present disclosure is not limited thereto. That is, data "1" may be written as the specific data. In this case, the size (W/L)n of the transistor Tr2 is designed to be smaller than the size (W/L) m of the transistor Tr5 ((W/L)n<(W/L)m).

Figure 12:
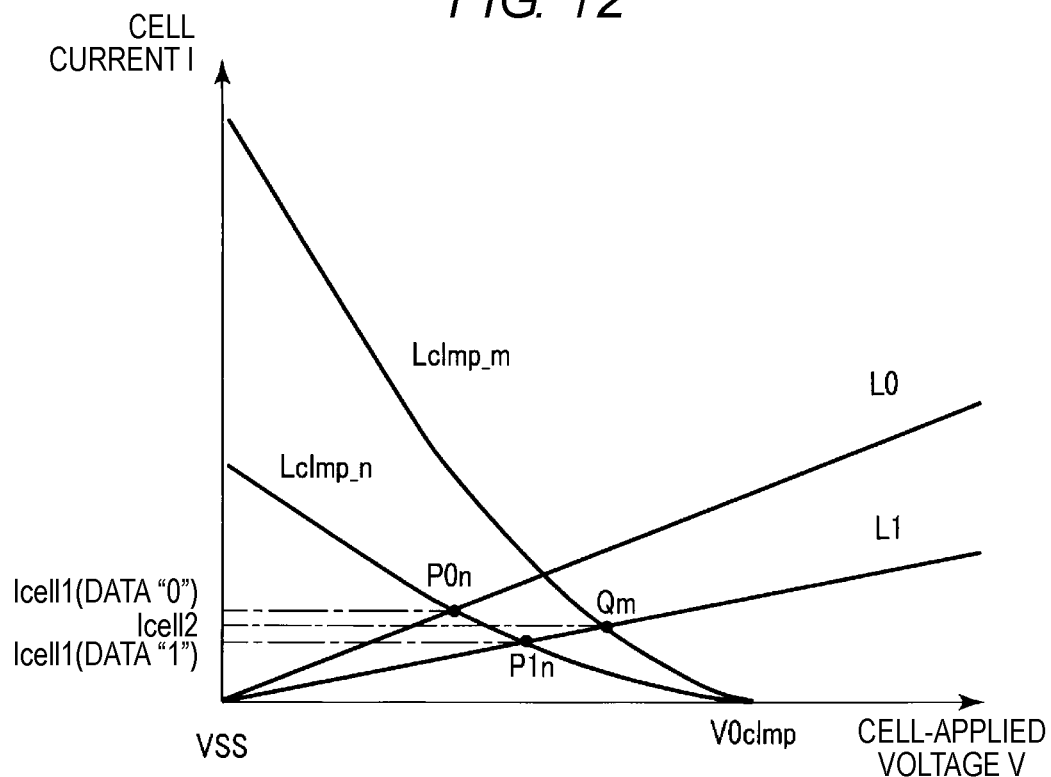
FIG. 12 is a diagram for explaining an effect of a semiconductor memory device according to a first modification of the first embodiment.

FIG. 12 is a diagram for explaining an effect of a semiconductor memory device according to a first modification of the first embodiment. FIG. 12 illustrates a diagram of operating point analysis of transistors Tr2, Tr5 and a memory cell MC in the first modification of the first embodiment.

In FIG. 12, a curved line Lclmp_m indicates a relationship between the current flowing through the transistor Tr2 and the voltage (VCLMP-Vth) at the first end of the transistor Tr2 when the current flows through the transistor Tr2. A curved line Lclmp_m indicates a relationship between the current flowing through the transistor Tr5 and the voltage (VCLMP-Vth) at the first end of the transistor Tr5 when the current flows through the transistor Tr5.

As illustrated in FIG. 12, since the size (W/L)m of the transistor Tr5 is larger than the size (W/L)n of the transistor Tr2 in the first read curved line Lclmp_m, the cell current Icell2 corresponding to the intersection point Qm is larger than the cell current Icell1 (data "1") corresponding to the intersection point P1n.

Therefore, in the first modification of the first embodiment, the voltage VCLMP and the sizes of the transistors Tr2 and Tr5 are set such that the cell current Icell2 corresponding to the intersection point Qm is smaller than the cell current Icell1 (data "0") corresponding to the intersection point P0n. As a result, the data of the memory cell MC may be read based on the relationship illustrated in FIG. 8.

2.2 Second Modification

Further, in the first embodiment, descriptions have been made on the case where the signal RE is commonly supplied to the transistors Tr3 and Tr6 and the signals RE1 and RE2 are supplied to the transistors Tr1 and Tr4, respectively, but the present disclosure is not limited thereto. That is, the functions of the transistors Tr1 and Tr4 and the functions of the transistors Tr3 and Tr6 are interchangeable.

Figure 13:
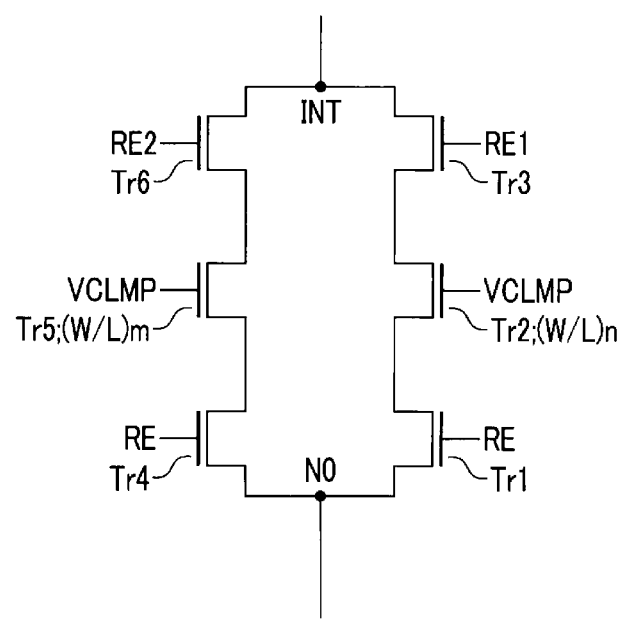
FIG. 13 is a diagram of a semiconductor memory device according to a second modification of the first embodiment.

FIG. 13 is a diagram for explaining a configuration of a semiconductor memory device according to a second modification of the first embodiment. As illustrated in FIG. 13, the signal RE is commonly supplied to the gate of the transistor Tr1 and the gate of the transistor Tr4. The signal RE1 is supplied to the gate of the transistor Tr3, and the signal RE2 is supplied to the gate of the transistor Tr6. The rest of the configuration is the same as in the first embodiment.

With the configuration as described above, the semiconductor memory device according to the second modification of the first embodiment may operate in the same manner as in the first embodiment, and in turn has the same effect as in the first embodiment.

2.3 Third Modification

In the semiconductor memory device according to the first embodiment, descriptions have been made of an example in which each of the transistors Tr2 and Tr5 is only a single transistor, but the present disclosure is not limited thereto.

Specifically, as illustrated in FIG. 14, the transistors Tr2 and Tr5 can be configured as a group of N transistors Tr2 (Tr2-1, Tr2-2, . . . and Tr2-N) each having the same size and a group of M transistors Tr5 (Tr5-1, Tr5-2, . . . Tr5-M) each having the same size, respectively. For example, the transistors Tr2-1 to Tr2-N and Tr5-1 to Tr5-M may all have the same size as each other, but the values M and N are unequal integer values.

In this case, each transistor in the transistor group Tr2 has a first end connected in common to the second end of the transistor Tr1, a second end connected in common to the first end of the transistor Tr3, a gate supplied with the voltage VCLMP. In addition, each transistor in the transistor group Tr5 has a first end connected in common to the second end of the transistor Tr4, a second end connected in common to the first end of the transistor Tr6, a gate supplied with the voltage VCLMP. That is, the N transistors Tr2-1 to Tr2-N in the transistor group Tr2 are connected in parallel between the second end of the transistor Tr1 and the first end of the transistor Tr3. In addition, the M transistors Tr5-1 to Tr5-M in the transistor group Tr5 are connected in parallel between the second end of the transistor Tr4 and the first end of the transistor Tr6.

With the configuration as described above, the transistor groups Tr2 and Tr5 may be regarded as synthesized transistors having different sizes due to the different numbers of transistors being connected in parallel. Therefore, for example, sizes of the transistor groups Tr2 and Tr5 for achieving an optimum sense margin may be changed by adjusting the number of transistors in the transistor groups Tr2 and Tr5. Thus, the optimum sense margin may be set for each semiconductor memory device according to a manufacturing variation of the semiconductor memory device.

2.4 Other Examples

Further, although descriptions have been made on the case where the semiconductor memory device according to the first embodiment is a magnetic memory device to which the magnetoresistance effect element 22 is applied as a resistive memory element, the present disclosure is not limited thereto. Specifically, the present disclosure is applicable to any semiconductor memory device having an element for storing data by resistance change, such as a resistive random access memory (ReRAM), a phase-change random access memory (PCRAM), and the like.

In addition, the present disclosure is also applicable to a semiconductor memory device having an element capable of storing data by resistance change accompanying a supply of a current or a voltage, or reading stored data by converting a resistance difference accompanying a resistance change into a current difference or voltage difference, regardless of whether the semiconductor memory device is a volatile memory or a nonvolatile memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a memory cell with a resistive memory element for storing data;
   a sense amplifier for reading stored data from the memory cell according to a state of the resistive memory element;
   a first transistor and a second transistor connected in parallel between a first node that is electrically connected to the memory cell and a second node that is electrically connected to the sense amplifier, the first transistor having a size that is different from a size of the second transistor, each of the first and second transistors having a gate connected to a first voltage source; and
   a switch circuit configured to control a conduction state between the first node and the second node via a first path through the first transistor and a second path through the second transistor, wherein
   the sense amplifier compares a first current supplied to the memory cell via the first path at a first timing with a second current supplied to the memory cell via the second path at a second timing different from the first timing.

2. The semiconductor memory device according to claim 1, wherein the switch circuit includes:
   a third transistor including a first end electrically connected to a first end of the first transistor and a second end electrically connected to the first node;
   a fourth transistor including a first end electrically connected to a first end of the second transistor and a second end electrically connected to the first node;

a fifth transistor including a first end electrically connected to a second end of the first transistor and a second end electrically connected to the second node; and a sixth transistor including a first end electrically connected to a second end of the second transistor and a second end electrically connected to the second node.

3. The semiconductor memory device according to claim 2, wherein
when the third transistor is in an ON state and the fourth transistor is in an OFF state, the first current is supplied to the memory cell, and
when the third transistor is in an OFF state and the fourth transistor is in an ON state, the second current is supplied to the memory cell.

4. The semiconductor memory device according to claim 3, wherein the first current and the second current are supplied to the memory cell at different times while the fifth transistor and the sixth transistor are both in an ON state.

5. The semiconductor memory device according to claim 2, wherein
when the fifth transistor is in an ON state and the sixth transistor is in an OFF state, the first current is supplied to the memory cell, and
when the fifth transistor is in an OFF state and the sixth transistor is in an ON state, the second current is supplied to the memory cell.

6. The semiconductor memory device according to claim 5, wherein the first current and the second current are supplied via the switching circuit at different times while the third transistor and the fourth transistor are both in an ON state.

7. The semiconductor memory device according to claim 1, further comprising:
a write circuit that writes data to the memory cell, wherein
the write circuit writes predetermined data to the memory cell before the second current is supplied to the memory cell and after the first current is supplied to the memory cell.

8. The semiconductor memory device according to claim 7, wherein the size of the first transistor is smaller than the size of the second transistor.

9. The semiconductor memory device according to claim 8, wherein
when the first current is larger than the second current, the sense amplifier reads data different from the predetermined data from the memory cell, and
when the first current is smaller than the second current, the sense amplifier reads data identical with the predetermined data from the memory cell.

10. The semiconductor memory device according to claim 1, wherein the size of the first transistor is larger than the size of the second transistor.

11. The semiconductor memory device according to claim 10, wherein
the sense amplifier is configured to output data identical to the predetermined data when the first current is larger than the second current, and
the sense amplifier outputs data different from the predetermined data when the first current is smaller than the second current.

12. The semiconductor memory device according to claim 1, wherein the size of the first transistor and the size of the second transistor is a ratio of respective gate width to respective gate length.

13. The semiconductor memory device according to claim 1, wherein the size of the first transistor includes a respect gate width and a respective gate length and the size of the second transistor includes a respect gate width and a respective gate length.

14. The semiconductor memory device according to claim 1, wherein each of the first transistor and the second transistor separately comprises a plurality of transistors that are connected in parallel between the first node and the second node and supplied with the first voltage.

15. The semiconductor memory device according to claim 1, wherein the resistive memory element is a magnetoresistance effect element.

16. A semiconductor memory device, comprising:
a memory cell array including a memory cells having a resistive memory element for storing data;
a sense amplifier for reading stored data from the memory cell array according to a state of the resistive memory element;
a switching circuit connected between a first node that is electrically connected to the memory cell and a second node electrically connected to the sense amplifier, the switching circuit including a first transistor and a second transistor connected in parallel between the first node and the second node, the first transistor having a size that is different from a size of the second transistor, each of the first and second transistors having a gate connected to a clamping voltage source, the switching circuit being configured to control a conduction state between the first node and the second node via first path through the first transistor and a second path through the second transistor; and
a controller configured to control the switching circuit such that the sense amplifier senses a first current supplied to the memory cell via the first path at a first time and a second current supplied to the memory cell via the second path at a second time, wherein
the sense amplifier reads data stored in the memory cell according to a relationship between a level of the first current and a level of the second current.

17. The semiconductor memory device according to claim 16, wherein
the size of the first transistor and the size of the second transistor is a ratio of respective gate width to respective gate length, and
the resistive memory element is a magnetoresistance effect element.

18. The semiconductor memory device according to claim 16, wherein the switch circuit further includes:
a third transistor including a first end electrically connected to a first end of the first transistor and a second end electrically connected to the first node;
a fourth transistor including a first end electrically connected to a first end of the second transistor and a second end electrically connected to the first node;
a fifth transistor including a first end electrically connected to a second end of the first transistor and a second end electrically connected to the second node; and
a sixth transistor including a first end electrically connected to a second end of the second transistor and a second end electrically connected to the second node.

19. A semiconductor memory device, comprising:
a memory cell with a resistive memory element for storing data;
a sense amplifier for reading stored data from the memory cell according to a state of the resistive memory element; and a switch circuit connected between a first node that is electrically connected to the memory cell and a second node that is electrically connected to the sense amplifier, the switch circuit configured to control a conduction state between the first node and the second node via a one of a first path through a first transistor and a second path through a second transistor, wherein the first transistor has a size that is different from a size of the second transistor, each of the first and second transistors have a gate connected to a first voltage source, and the sense amplifier compares a first current supplied to the memory cell via the first path at a first time and a second current supplied to the memory cell via the second path at a second time different from the first time.

20. The semiconductor memory device according to claim 19, wherein the switch circuit comprises:
a third transistor including a first end electrically connected to a first end of the first transistor and a second end electrically connected to the first node;
a fourth transistor including a first end electrically connected to a first end of the second transistor and a second end electrically connected to the first node;
a fifth transistor including a first end electrically connected to a second end of the first transistor and a second end electrically connected to the second node; and
a sixth transistor including a first end electrically connected to a second end of the second transistor and a second end electrically connected to the second node.

* * * * *